United States Patent
Bindra et al.

(10) Patent No.: US 10,748,849 B2
(45) Date of Patent: Aug. 18, 2020

(54) TAPERING DISCRETE INTERCONNECTION FOR AN INTEGRATED CIRCUIT (IC)

(71) Applicant: Taiwan Semiconductor Manufacturing Co., Ltd., Hsinchu (TW)

(72) Inventors: Jaskirat Bindra, San Jose, CA (US); Kumar Lalgudi, Fremont, CA (US)

(73) Assignee: Taiwan Semiconductor Manufacturing Co., Ltd. (TW)

(*) Notice: Subject to any disclaimer, the term of this patent is extended or adjusted under 35 U.S.C. 154(b) by 0 days.

(21) Appl. No.: 16/397,229

(22) Filed: Apr. 29, 2019

(65) Prior Publication Data
US 2019/0252309 A1    Aug. 15, 2019

Related U.S. Application Data

(63) Continuation of application No. 15/717,017, filed on Sep. 27, 2017, now Pat. No. 10,276,497.

(51) Int. Cl.
*H01L 23/528* (2006.01)
*H01L 23/522* (2006.01)

(52) U.S. Cl.
CPC ........ *H01L 23/528* (2013.01); *H01L 23/5226* (2013.01)

(58) Field of Classification Search
CPC .................... H01L 23/528; H01L 23/5226
See application file for complete search history.

(56) References Cited

U.S. PATENT DOCUMENTS

| 8,841,779 | B2 | 9/2014 | Pendse |
| 2018/0033770 | A1* | 2/2018 | Hsu ........................ H01L 25/105 |
| 2019/0096799 | A1 | 3/2019 | Bindra et al. |

FOREIGN PATENT DOCUMENTS

| TW | 201225210 A | 6/2012 |
| TW | 201232701 A | 8/2012 |

* cited by examiner

*Primary Examiner* — Marc Anthony Armand
(74) *Attorney, Agent, or Firm* — Sterne, Kessler, Goldstein & Fox P.L.L.C.

(57) ABSTRACT

A discrete tapering interconnection is disclosed that forms an interconnection between a first electronic circuit and a second electronic circuit within an integrated circuit. The discrete tapering interconnection includes a first set of multiple parallel conductors situated in a first metal layer of the metal layers of a semiconductor layer stack and a second set of multiple parallel conductors situated in a second metal layer of the metal layers of the semiconductor layer stack. The first set of multiple parallel conductors effectively taper the discrete tapering interconnection as the discrete tapering interconnection traverse between the first electronic circuit and/or the second electronic circuit. This tapering of the discrete tapering interconnection can be an asymmetric tapering or a symmetric tapering. The second set of multiple parallel conductors is arranged to form various interconnections between various parallel conductors from among the first set of multiple parallel conductors.

20 Claims, 5 Drawing Sheets

TAPERING DISCRETE INTERCONNECTION FOR AN INTEGRATED CIRCUIT (IC)

CROSS-REFERENCE TO RELATED APPLICATIONS

The present application is a continuation of U.S. patent application Ser. No. 15/717,017, filed Sep. 27, 2017, which is incorporated herein by reference in its entirety.

BACKGROUND

The continued improvement of semiconductor fabrication processes has allowed manufacturers and designers to create a smaller and a more powerful electronic device. Semiconductor device fabrication has progressed from a 10 μm semiconductor fabrication process that was reached around 1971 to a 22 nm semiconductor fabrication process that was reached around 2012. The semiconductor device fabrication is expected to further progress onto a 5 nm semiconductor fabrication process around 2019. With each progression of the semiconductor fabrication process, components of the integrated circuits have become smaller to allow more components to be fabricated onto the semiconductor substrate. However, with each progression of the semiconductor fabrication process, new challenges in creating integrated circuits have been uncovered. One such new challenge relates to interconnections between various circuits within the integrated circuits. For more advanced technology nodes, such as the 5 nm semiconductor fabrication process, resistances and/or capacitances of the interconnections can be large and can degrade electrical characteristics of signals propagating within the interconnections.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
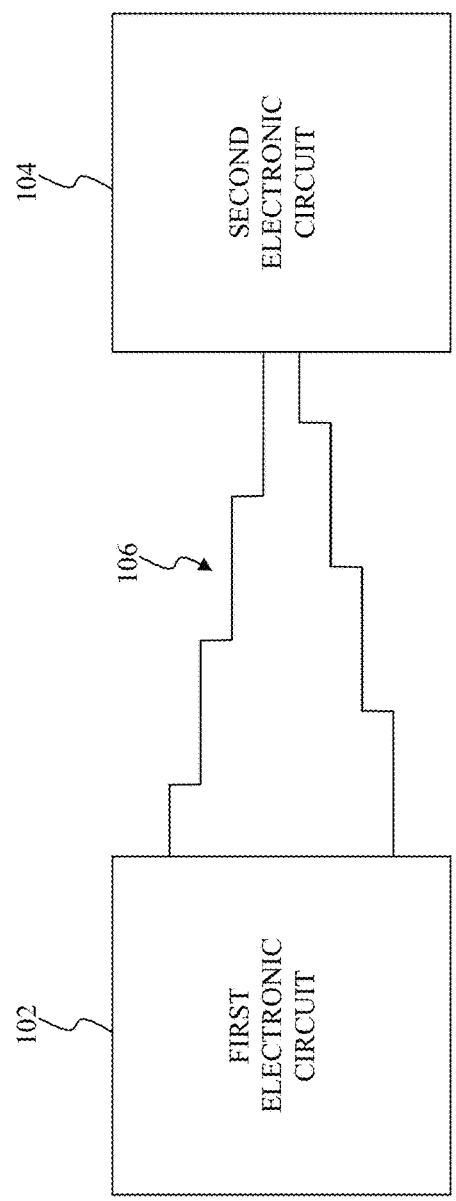
FIG. 1 illustrates a block diagram of an exemplary integrated circuit according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations described.

Overview

A discrete tapering interconnection is disclosed that forms an interconnection between a first electronic circuit, such as a transmitter to provide an example, and a second electronic circuit, such as a receiver to provide an example, within an integrated circuit. The discrete tapering interconnection includes a first set of multiple parallel conductors situated in a first metal layer of the metal layers of a semiconductor layer stack and a second set of multiple parallel conductors situated in a second metal layer of the metal layers of the semiconductor layer stack. Herein, the terms "first metal layer" and "second metal layer" are merely used to distinguish between metal layers of the semiconductor layer stack. The terms "first metal layer" and "second metal layer" need not be the first metal and the second metal, respectively, of the semiconductor layer stack. Rather, those skilled in the relevant art(s) will recognize the terms "first metal layer" and "second metal layer" can be any two different metal layers of the semiconductor layer stack. The first set of multiple parallel conductors effectively taper the discrete tapering interconnection as the discrete tapering interconnection traverse between the first electronic circuit and/or the second electronic circuit. This tapering of the discrete tapering interconnection can be an asymmetric tapering or a symmetric tapering. The second set of multiple parallel conductors is configured and arranged to form various interconnections between various parallel conductors from among the first set of multiple parallel conductors.

First Exemplary Integrated Circuit

FIG. 1 illustrates a block diagram of an exemplary integrated circuit according to an exemplary embodiment of the present disclosure. An integrated circuit 100 can include analog and/or digital circuits which are fabricated on one or more diffusion layers, one or more polysilicon layers, and/or metal layers of a semiconductor layer stack. Moreover, the integrated circuit 100 can include one or more discrete tapering interconnections within the metal layers of the semiconductor layer stack to interconnect the analog and/or digital circuits. As illustrated in FIG. 1, the integrated circuit 100 includes a first electronic circuit 102 communicatively coupled to a second electronic circuit 104 by a discrete tapering interconnection 106.

The first electronic circuit 102 and the second electronic circuit 104 can include one or more analog circuits, one or more digital circuits, and/or one or more mixed-signal circuits. The one or more analog circuits operate on one or more analog signals that continuously vary in time. The one or more analog circuits can include one or more current sources, one or more current mirrors, one or more amplifiers, one or more bandgap references, and/or other suitable analog circuits that will be apparent to those skilled in the relevant art(s) without departing from the spirit and scope of the present disclosure. The one or more digital circuits operate on one or more digital signals having one or more discrete levels. The one or more digital circuits can include one or more logic gates, such as logical AND gates, logical OR gates, logical XOR gates, logical XNOR gates, or logical NOT gates to provide some examples, and/or other suitable digital circuits that will be apparent to those skilled in the relevant art(s) without departing from the spirit and scope of the present disclosure. The one or more mixed-signal circuits represent a combination of the one or more analog circuits and the one or more digital circuits. In an exemplary embodiment, the first electronic circuit 102 and the second electronic circuit 104 can represent one or more standard cells that are selected from the predefined library of standard cells. The one or more standard cells include one or more semiconductor devices that are fabricated on one or more diffusion layers, one or more polysilicon layers, and/or metal layers of a semiconductor layer stack and/or one or more interconnections between various layers of the semiconductor layer stack.

As illustrated in FIG. 1, the discrete tapering interconnection 106 forms an interconnection between the first electronic circuit 102 and the second electronic circuit 104. In an exemplary embodiment, the discrete tapering interconnection 106 includes a first set of multiple parallel conductors situated in a first metal layer of the metal layers of the semiconductor layer stack and a second set of multiple parallel conductors situated in a second metal layer of the metal layers of the semiconductor layer stack. In the exemplary embodiment illustrated in FIG. 1, the first set of multiple parallel conductors effectively taper the one or more discrete tapering interconnections as the one or more discrete tapering interconnections traverse between the first electronic circuit 102 and the second electronic circuit 104. This tapering of the discrete tapering interconnection 106 can be an asymmetric tapering as to be discussed below in FIG. 2 or a symmetric tapering as to be discussed below in FIG. 3. Moreover, this tapering of the discrete tapering interconnection 106 reduces net delay between the between the first electronic circuit 102 and the second electronic circuit 104 result in higher operating frequencies for the integrated circuit 100. For example, the discrete tapering interconnection 106 reduces the net delay by decreasing a load of the discrete tapering interconnection 106, such as resistance, present on the first electronic circuit 102. In an exemplary embodiment, the discrete tapering interconnection 106 is implemented within one or more critical signal pathways of the integrated circuit 100.

The second set of multiple parallel conductors is configured and arranged to form various interconnections between various parallel conductors from among the first set of multiple parallel conductors. In an exemplary embodiment, the first set of multiple parallel conductors and the second set of multiple parallel conductors are rectangular. However, those skilled in the relevant art(s) will recognize other configurations and arrangements are possible for the first set of multiple parallel conductors and the second set of multiple parallel conductors, such as right trapezoids to provide an example, without departing from the spirit and scope of the present disclosure.

First Exemplary Discrete Tapering Interconnection

Figure 2:
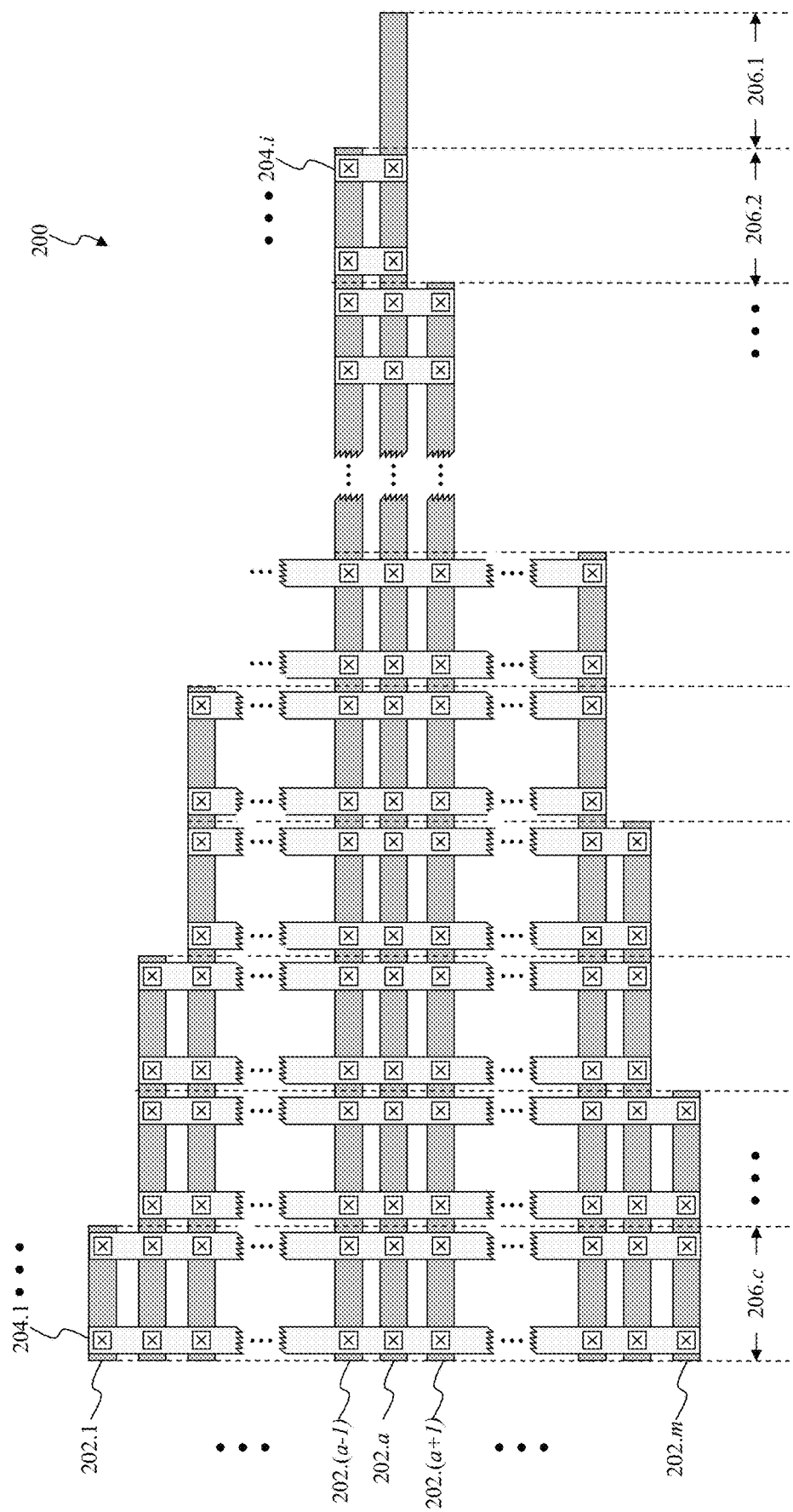
FIG. 2 illustrates an electronic architectural design of a first exemplary discrete tapering interconnection of the exemplary integrated circuit according to an exemplary embodiment of the present disclosure.

FIG. 2 illustrates an electronic architectural design of a first exemplary discrete tapering interconnection of the exemplary integrated circuit according to an exemplary embodiment of the present disclosure. The electronic architectural design as illustrated in FIG. 2 is a representation of an asymmetric discrete tapering interconnection 200 in terms of planar geometric shapes which correspond to patterns of material situated in the metal layers of the semiconductor layer stack, locations of the planar geometric shapes, and/or interconnections between the planar geometric shapes. In the exemplary embodiment illustrated in FIG. 2, the asymmetric discrete tapering interconnection 200 includes a first set of parallel conductors 202.1 through 202.$m$ situated in a first metal layer of the metal layers of the semiconductor layer stack and a second set of parallel conductors 204.1 through 204.$i$ situated in a second metal layer of the metal layers of the semiconductor layer stack. As to be described below, the lengths of the first set of parallel conductors 202.1 through 202.$m$ can differ from one another forming an asymmetric tapering for the tapering interconnection 200. The asymmetric discrete tapering interconnection 200 can represent an exemplary embodiment of the discrete tapering interconnection 106 as described above in FIG. 1.

The first set of parallel conductors 202.1 through 202.$m$ is situated in the first metal layer, illustrated using dark solid gray shading in FIG. 2, of the metal layers of the semiconductor layer stack. Although the first set of parallel conductors 202.1 through 202.$m$ are illustrated as including one parallel conductor, this is for illustratively purposes only. Those skilled in the relevant art(s) will recognize one or more of the first set of parallel conductors 202.1 through 202.$m$ can include more than one parallel conductor without departing from the spirit and scope of the present disclosure. In an exemplary embodiment, the first set of parallel conductors 202.1 through 202.$m$ includes an odd number of parallel conductors, such as three parallel conductors, five parallel conductors, or seven parallel conductors to provide some examples. However, those skilled in the relevant art(s) will recognize the first set of parallel conductors 202.1 through 202.$m$ can alternatively include an even number of parallel conductors, such as two parallel conductors, four parallel conductors, or six parallel conductors to provide some examples, without departing from the spirit and the scope of the present disclosure. The first set of parallel conductors 202.1 through 202.$m$ can be formed using one or more conductive materials such as tungsten (W), aluminum (Al), copper (Cu), gold (Au), silver (Ag), platinum (Pt), or any other suitable conductive material that will be apparent to those skilled in the relevant art(s) without departing from the spirit and scope of the present disclosure. As illustrated in FIG. 2, the first set of parallel conductors 202.1 through 202.$m$ is situated in a horizontal axis, such as, along an x-axis of the Cartesian coordinate system. Moreover, a first side of each parallel conductor from among the first set of parallel conductors 202.1 through 202.$m$ is arranged to coincide with a vertical axis, such as, a y-axis of the Cartesian coordinate system, that is perpendicular to the horizontal axis. In an exemplary embodiment, the first side of each parallel conductor from among the first set of parallel conductors 202.1 through 202.$m$ is communicatively coupled to one or more first analog circuits, one or more first digital circuits, and/or one or more first mixed-signal circuits, such as the first electronic circuit 102 to provide an example. In this exemplary embodiment, the first sides of the first set of parallel conductors 202.1 through 202.$m$ are effectively shorted to one another.

The first set of parallel conductors 202.1 through 202.$m$ can be characterized as having corresponding widths from among widths $W_1$ through $W_m$ and corresponding lengths from among lengths $L_1$ through $L_m$. In the exemplary embodiment illustrated in FIG. 2, the lengths $L_1$ through $L_m$ represent distances along the horizontal axis and the widths $W_1$ through $W_m$ represent distances along the vertical axis.

As illustrated in FIG. 2, the widths $W_1$ through $W_m$ of the first set of parallel conductors 202.1 through 202.m are substantially similar to one another. In an exemplary embodiment, the widths $W_1$ through $W_m$ correspond to a minimum width as defined by a semiconductor fabrication foundry and/or a semiconductor fabrication technology node. This minimum width is available for other interconnections with an integrated circuit, such as the integrated circuit 100 to provide an example; thereby eliminating the need to design and/or to fabricate specialized interconnections for the first set of parallel conductors 202.1 through 202.m which improves routing efficiency for the integrated circuit.

Additionally, in the exemplary embodiment illustrated in FIG. 2, the lengths $L_1$ through $L_m$ of the first set of parallel conductors 202.1 through 202.m can differ from one another. This difference between the lengths $L_1$ through $L_m$ can be characterized as:

$$L_a > L_{a-1} > L_{a+1} \ldots > L_m > L_1, \tag{1}$$

where the length $L_a$ corresponds to a parallel conductor 202.a from among the parallel conductors 202.1 through 202.m, the length $L_{a-1}$ corresponds to a parallel conductor 202.(a−1) from among the parallel conductors 202.1 through 202.m, the length $L_{a+1}$ corresponds to a parallel conductor 202.(a+1) from among the parallel conductors 202.1 through 202.m, the length $L_m$ corresponds to the parallel conductor 202.m from among the parallel conductors 202.1 through 202.m, and the length $L_1$ corresponds to the parallel conductor 202.1 from among the parallel conductors 202.1 through 202.m. In the exemplary embodiment illustrated in FIG. 2, a second side of a parallel conductor from among the first set of parallel conductors 202.1 through 202.m having a largest length from among the lengths $L_1$ through $L_m$, such as the parallel conductor 202.a having the length $L_a$ to provide an example, is communicatively coupled to one or more second analog circuits, one or more second digital circuits, and/or one or more second mixed-signal circuits, such as the second electronic circuit 104 to provide an example. As a result of the difference between the lengths $L_1$ through $L_m$, second sides of all other parallel conductors from among the first set of parallel conductors 202.1 through 202.m are not communicatively coupled to the one or more second analog circuits, the one or more second digital circuits, and/or the one or more second mixed-signal circuits in this exemplary embodiment. In an exemplary embodiment, the lengths $L_1$ through $L_m$ of the first set of parallel conductors 202.1 through 202.m can be determined relative to the parallel conductor 202.a having the length $L_a$ by:

$$L[k] = L_a - (R[k] - 1) * \frac{L_a}{m}, \tag{2}$$

where the L[k] represents a length of a parallel conductor k from among the parallel conductors 202.1 through 202.m, R[k] represents an integer relationship between the parallel conductor k and the parallel conductor 202.a, length $L_a$ represents the length of parallel conductor 202.a, and m represents the number parallel conductors of the first set of parallel conductors 202.1 through 202.m. For example, as illustrated in FIG. 2, the length $L_{a-1}$ of the parallel conductor 202.(a−1) from among the parallel conductors 202.1 through 202.m having a second largest length, namely $$R = 2, \text{ is } L_a - \frac{L_a}{m}.$$

In this example, the length $L_{a+1}$ of the parallel conductor 202.(a+1) from among the parallel conductors 202.1 through 202.m having a third largest length, namely $$R = 3, \text{ is } L_a - 2 * \frac{L_a}{m}.$$

Also in this example, the length $L_1$ of the parallel conductor 202.1 from among the parallel conductors 202.1 through 202.m having an $m^{th}$ largest length, namely R=m, is $$L_a - (m - 1) * \frac{L_a}{m}.$$

Moreover, the difference between the lengths $L_1$ through $L_m$ of the first set of parallel conductors 202.1 through 202.m can be characterized as forming the asymmetric tapering for the tapering interconnection 200 as illustrated in FIG. 2. In an exemplary embodiment, this asymmetric tapering is asymmetric relative to a first parallel conductor from among the first set of parallel conductors 202.1 through 202.m having the largest length, such as the parallel conductor 202.a having the length $L_a$ to provide an example. In this exemplary embodiment, the first set of parallel conductors 202.1 through 202.m sequentially alternate around the parallel conductor 202.a to form the asymmetric tapering. Additionally, in this exemplary embodiment, a second parallel conductor from among the first set of parallel conductors 202.1 through 202.m having a second largest length, such as the parallel conductor 202.(a−1) having the length $L_{a-1}$ to provide an example, and a third parallel conductor from among the first set of parallel conductors 202.1 through 202.m having a third largest length, such as the parallel conductor 202.(a+1) having the length $L_{a+1}$ to provide an example, are situated adjacent a first side and a second side, respectively, of the parallel conductor 202.a. This sequential alternation of the first set of parallel conductors 202.1 through 202.m around the parallel conductor 202.a effectively tapers the tapering interconnection 200 from a first side including the first set of parallel conductors 202.1 through 202.m to a second side including only the parallel conductor 202.a.

In the exemplary embodiment illustrated in FIG. 2, the first set of parallel conductors 202.1 through 202.m is configured and arranged to be in shapes of rectangles to form an asymmetric piecewise linear staircase tapering of the asymmetric discrete tapering interconnection 200. However, those skilled in the relevant art(s) will recognize other configurations and arrangements are possible for the first set of parallel conductors 202.1 through 202.m, such as right trapezoids to provide an example, without departing from the spirit and scope of the present disclosure. As illustrated in FIG. 2, this asymmetric piecewise linear staircase tapering can be characterized as including asymmetric linear staircase segments 206.1 through 206.c, which, when combined, form the asymmetric piecewise linear staircase tapering of the asymmetric discrete tapering interconnection 200. For example, the linear staircase segment 206.1 includes the parallel conductor 202.a. In this example, the linear staircase segment 206.2 includes the parallel conductor 202.a and the parallel conductor 202.(a−1). Similarly, in this example, the linear staircase segment 206.c includes the first set of parallel conductors 202.1 through 202.m. As such, the asymmetric linear staircase segments 206.1 through 206.c include more parallel conductors from among the parallel conductors 202.1 through 202.m than their preceding linear staircase segments from among the asymmetric linear staircase segments 206.1 through 206.c. As an example, the linear staircase segment 206.2 includes two parallel conductors from among the parallel conductors 202.1 through 202.m and the linear staircase segment 206.1 includes one parallel conductor from among the parallel conductors 202.1 through 202.m. Likewise, the asymmetric linear staircase segments 206.1 through 206.c include less linear staircase segments from among the asymmetric linear staircase segments 206.1 through 206.c than their subsequent linear staircase segments from among the asymmetric linear staircase segments 206.1 through 206.c. As an example, the linear staircase segment 206.1 includes one parallel conductor from among the parallel conductors 202.1 through 202.m and the linear staircase segment 206.2 includes two parallel conductors from among the parallel conductors 202.1 through 202.m.

The second set of parallel conductors 204.1 through 204.i is situated in the second metal layer, illustrated using light solid gray shading in FIG. 2, of the metal layers of the semiconductor layer stack. In an exemplary embodiment, the second set of parallel conductors 204.1 through 204.i is approximately perpendicular to the first set of parallel conductors 202.1 through 202.m. For example, the first set of parallel conductors 202.1 through 202.m can be situated in a horizontal axis, such as, along an x-axis of a Cartesian coordinate system, and the second set of parallel conductors 204.1 through 204.i can be situated in a vertical axis, such as, along a y-axis of the Cartesian coordinate system. As illustrated in FIG. 2, the second set of parallel conductors 204.1 through 204.i is configured and arranged to provide various interconnections between the first set of parallel conductors 202.1 through 202.m. As illustrated in FIG. 2, the asymmetric discrete tapering interconnection 200 includes vias, shown using squared-x's in FIG. 2, to form the interconnections between the first set of parallel conductors 202.1 through 202.m and the second set of parallel conductors 204.1 through 204.i. In some situations, two or more of the vias can be combined to one or more via bridges forming the interconnections between the first set of parallel conductors 202.1 through 202.m and the second set of parallel conductors 204.1 through 204.i. In the exemplary embodiment illustrated in FIG. 2, each asymmetric linear staircase segment from among the asymmetric linear staircase segments 206.1 through 206.c includes a similar number of parallel conductors from among the second set of parallel conductors 204.1 through 204.i; however, one or more linear staircase segments from among the asymmetric linear staircase segments 206.1 through 206.c can include a dissimilar number of parallel conductors from among the second set of parallel conductors 204.1 through 204.i as will be apparent to those skilled in the relevant art(s) without departing from the spirit and scope of the present disclosure. In an exemplary embodiment, the second set of parallel conductors 204.1 and 204.i within each asymmetric linear staircase segment from among the asymmetric linear staircase segments 206.1 through 206.c is separated from the second set of parallel conductors 204.i and 204.1, respectively, within one or more neighboring linear staircase segments from among the asymmetric linear staircase segments 206.1 through 206.c by a minimum spacing as defined by a semiconductor fabrication foundry and/or a semiconductor fabrication technology node.

Second Exemplary Discrete Tapering Interconnection

Figure 3:
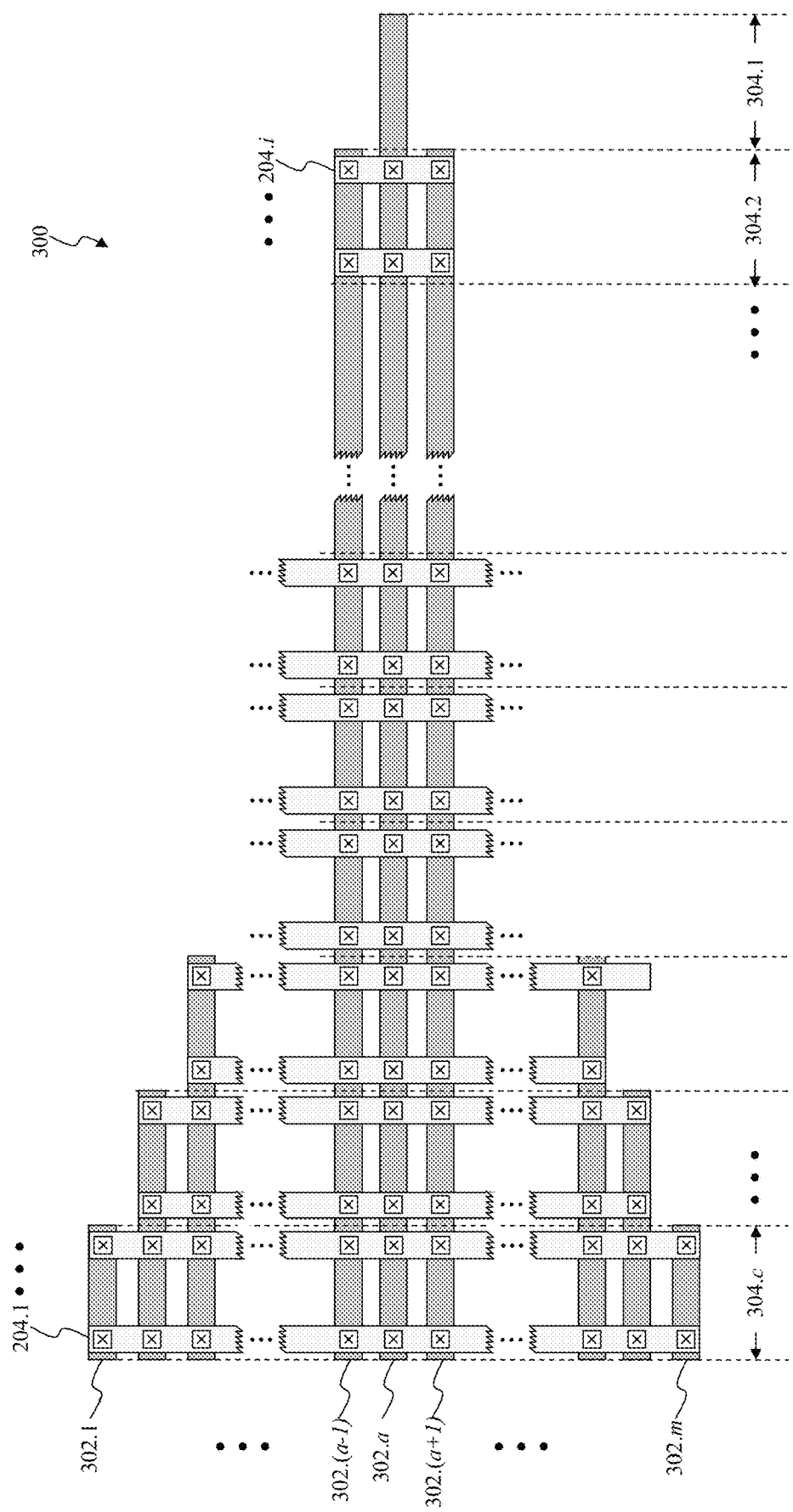
FIG. 3 illustrates an electronic architectural design of a second exemplary discrete tapering interconnection of the exemplary integrated circuit according to an exemplary embodiment of the present disclosure.

FIG. 3 illustrates an electronic architectural design of a second exemplary discrete tapering interconnection of the exemplary integrated circuit according to an exemplary embodiment of the present disclosure. The electronic architectural design as illustrated in FIG. 3 is a representation of a symmetric discrete tapering interconnection 300 in terms of planar geometric shapes which correspond to patterns of material situated in the metal layers of the semiconductor layer stack, locations of the planar geometric shapes, and/or interconnections between the planar geometric shapes. In the exemplary embodiment illustrated in FIG. 3, the symmetric discrete tapering interconnection 300 includes a first set of parallel conductors 302.1 through 302.m situated in the first metal layer of the metal layers of the semiconductor layer stack and the second set of parallel conductors 204.1 through 204.i situated in the second metal layer of the metal layers of the semiconductor layer stack. Although the first set of parallel conductors 302.1 through 302.m are illustrated as including one parallel conductor, this is for illustratively purposes only. Those skilled in the relevant art(s) will recognize one or more of the first set of parallel conductors 302.1 through 302.m can include more than one parallel conductor without departing from the spirit and scope of the present disclosure. As to be described below, lengths of groups of parallel conductors from among the first set of parallel conductors 302.1 through 302.m can differ from one another while the lengths of the parallel conductors within each group of the parallel conductors can be similar to one another forming a symmetric tapering for the tapering interconnection 300. The symmetric discrete tapering interconnection 300 can represent an exemplary embodiment of the discrete tapering interconnection 106 as described above in FIG. 1.

The first set of parallel conductors 302.1 through 302.m is situated in the first metal layer, illustrated using dark solid gray shading in FIG. 3, of the metal layers of the semiconductor layer stack in a substantially similar manner as the first set of parallel conductors 202.1 through 202.m as described above in FIG. 2; therefore, only differences between the first set of parallel conductors 302.1 through 302.m and the first set of parallel conductors 202.1 through 202.m are to be described in further detail. The first set of parallel conductors 302.1 through 302.m can be characterized as having corresponding lengths from among lengths $L_1$ through $L_m$ in a substantially similar manner as the first set of parallel conductors 202.1 through 202.m. However, the lengths $L_1$ through $L_m$ of groups of parallel conductors from among the first set of parallel conductors 302.1 through 302.m can differ from one another whereas the lengths $L_1$ through $L_m$ of the parallel conductors from among the groups of parallel conductors are substantially similar. As such, the lengths $L_1$ through $L_m$ of the first set of parallel conductors 302.1 through 302.m can be characterized as:

$$L_a > \{L_{a-1}, L_{a+1}\} \ldots > \{L_1, L_m\}, \qquad (3)$$

where the length $L_a$ corresponds to a parallel conductor 302.a from among the parallel conductors 302.1 through 302.m, the group $\{L_{a-1}, L_{a+1}\}$ corresponds to the length $L_{a-1}$ of a parallel conductor 302.(a−1) from among the parallel conductors 302.1 through 302.m and the length $L_{a+1}$ of a parallel conductor 302.(a+1) from among the parallel conductors 302.1 through 302.m, and the group $\{L_1, L_m\}$ corresponds to the length $L_1$ of the parallel conductor 302.1 from among the parallel conductors 302.1 through 302.$m$ and the length $L_m$ of the parallel conductor 302.$m$ from among the parallel conductors 302.1 through 302.$m$. As indicated by this characterization, the length $L_a$ is greater than the length $L_{a-1}$ and the length $L_{a+1}$ and the length $L_{a-1}$ is approximately equal to the length $L_{a+1}$. In an exemplary embodiment, the lengths $L_1$ through $L_m$ of the groups of parallel conductors from among the first set of parallel conductors 302.1 through 302.$m$ can be determined relative to the parallel conductor 302.$a$ having the length $L_a$ by:

$$L[k] = L_a - (R[k]-1) * \frac{L_a}{m}, \qquad (4)$$

where the L[k] represents lengths of parallel conductors of a $k^{th}$ group of parallel conductors from among the parallel conductors 302.1 through 302.$m$, R[k] represents an integer relationship between the $k^{th}$ group of parallel conductors and the parallel conductor 302.$a$, length $L_a$ represents the length of parallel conductor 302.$a$, and m represents a number of groups of parallel conductors from among the first set of parallel conductors 302.1 through 302.$m$. For example, as illustrated in FIG. 3, the length $L_{a-1}$ of the parallel conductor 302.($a$−1) and the length $L_{a+1}$ of the parallel conductor 302.($a$+1) from among a second group of parallel conductors from among the parallel conductors 302.1 through 302.$m$ having a second largest length, namely $$R = 2, \text{ is } L_a - \frac{L_a}{m}.$$

In the exemplary embodiment illustrated in FIG. 3, a second side of a parallel conductor from among the first set of parallel conductors 302.1 through 302.$m$ having a largest length from among the lengths $L_1$ through $L_m$, such as the parallel conductor 302.$a$ having the length $L_a$ to provide an example, is communicatively coupled to one or more second analog circuits, one or more second digital circuits, and/or one or more second mixed-signal circuits, such as the second electronic circuit 104 to provide an example. As a result of the difference between the lengths $L_1$ through $L_m$ of the groups of parallel conductors from among the first set of parallel conductors 302.1 through 302.$m$, second sides of all other parallel conductors from among the first set of parallel conductors 302.1 through 302.$m$ are not communicatively coupled to the one or more second analog circuits, the one or more second digital circuits, and/or the one or more second mixed-signal circuits in this exemplary embodiment.

Moreover, the difference between the lengths $L_1$ through $L_m$ of the groups of parallel conductors from among the first set of parallel conductors 302.1 through 302.$m$ can be characterized as forming the symmetric tapering for the tapering interconnection 300 as illustrated in FIG. 3. In an exemplary embodiment, this symmetric tapering is symmetric relative to a first parallel conductor from among the first set of parallel conductors 302.1 through 302.$m$ having the largest length, such as the parallel conductor 302.$a$ having the length $L_a$ to provide an example. In this exemplary embodiment, the first set of parallel conductors 302.1 through 302.$m$ sequentially alternate around the parallel conductor 302.$a$ to form the asymmetric tapering. Additionally, in this exemplary embodiment, a second group of parallel conductors from among the first set of parallel conductors 302.1 through 302.$m$ having a second largest length, such as the parallel conductor 302.($a$−1) and the parallel conductor 302.($a$−1) having the length $L_{a-1}$ to provide some examples, are situated a first side and a second side, respectively, of the parallel conductor 302.$a$. This sequential alternation of the first set of parallel conductors 302.1 through 302.$m$ around the first parallel conductor 302.$a$ effectively tapers the tapering interconnection 300 from a first side including the first set of parallel conductors 302.1 through 302.$m$ to a second side including only the parallel conductor 302.$a$.

In the exemplary embodiment illustrated in FIG. 3, the first set of parallel conductors 302.1 through 302.$m$ is configured and arranged to be in shapes of rectangles to form a symmetric piecewise linear staircase tapering of the symmetric discrete tapering interconnection 300. However, those skilled in the relevant art(s) will recognize other configurations and arrangements are possible for the first set of parallel conductors 302.1 through 302.$m$, such as right trapezoids to provide an example, without departing from the spirit and scope of the present disclosure. As illustrated in FIG. 3, this symmetric piecewise linear staircase tapering of the symmetric discrete tapering interconnection 300 can be characterized as including symmetric linear staircase segments 304.1 through 304.$c$, which, when combined, form the symmetric piecewise linear staircase tapering of the symmetric discrete tapering interconnection 300. For example, the linear staircase segment 304.1 includes the parallel conductor 302.$a$. In this example, the linear staircase segment 304.2 includes the parallel conductor 302.$a$, the parallel conductor 302.($a$−1), and the parallel conductor 302.($a$+1). Similarly, in this example, the linear staircase segment 304.$c$ includes the first set of parallel conductors 302.1 through 302.$m$. As such, each symmetric linear staircase segment from among the symmetric linear staircase segments 304.1 through 304.$c$ includes more parallel conductors from among the parallel conductors 302.1 through 302.$m$ than its preceding linear staircase segment from among the symmetric linear staircase segments 304.1 through 304.$c$. As an example, the linear staircase segment 304.2 includes three parallel conductors from among the parallel conductors 302.1 through 302.$m$ and the linear staircase segment 304.1 includes one parallel conductor from among the parallel conductors 302.1 through 302.$m$. Likewise, each symmetric linear staircase segment from among the symmetric linear staircase segments 304.1 through 304.$c$ includes less linear staircase segments from among the symmetric linear staircase segments 304.1 through 304.$c$ than its subsequent linear staircase segment from among the symmetric linear staircase segments 304.1 through 304.$c$. As an example, the linear staircase segment 304.1 includes one parallel conductor from among the parallel conductors 302.1 through 302.$m$ and the linear staircase segment 304.2 includes three parallel conductors from among the parallel conductors 302.1 through 302.$m$.

Figure 4:
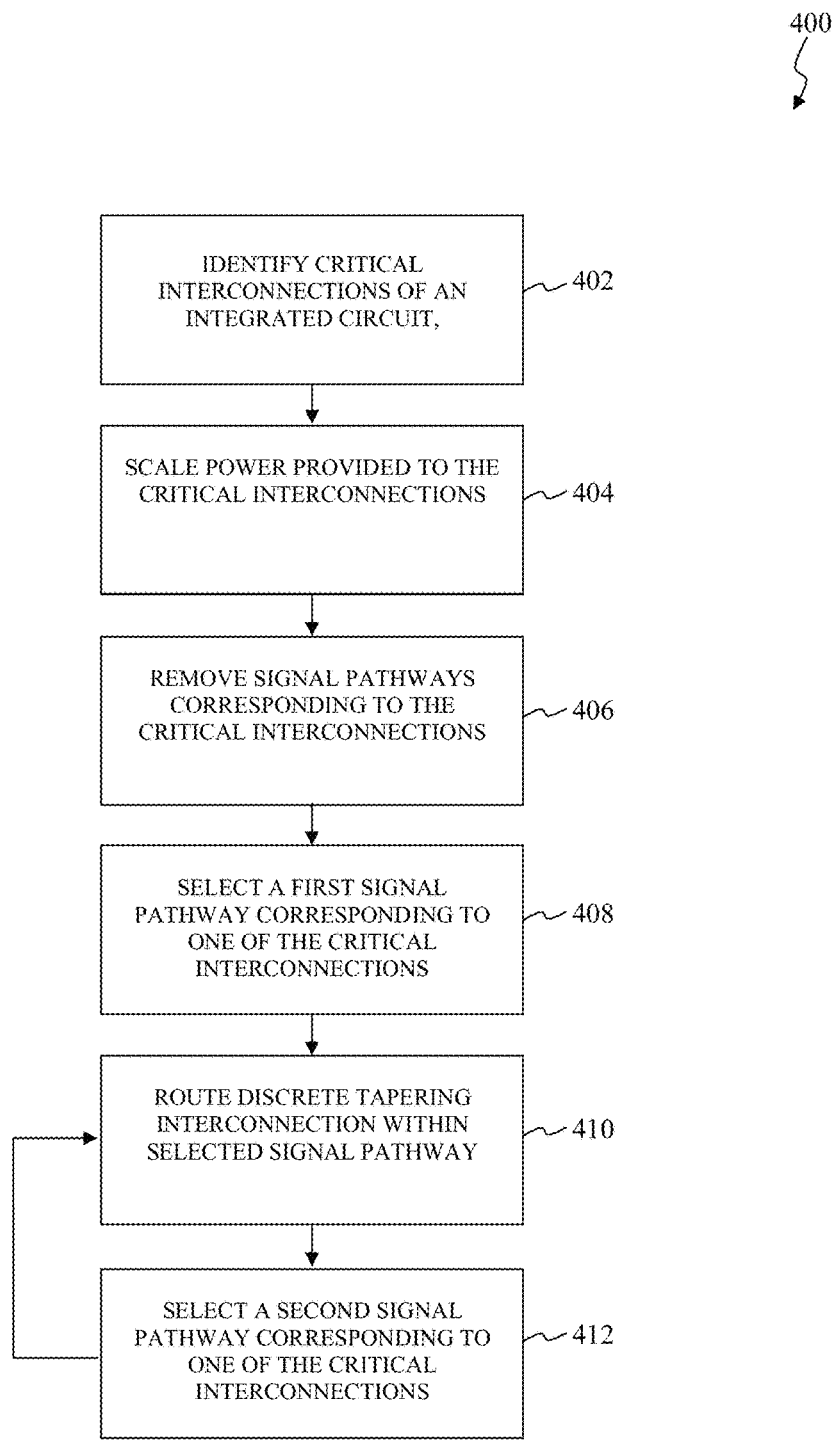
FIG. 4 illustrates a flowchart of an exemplary operation of the exemplary integration of the first and the second exemplary discrete tapering interconnections within an electronic architectural design according to an exemplary embodiment of the present disclosure.

Exemplary Integration of the First and the Second Exemplary Discrete Tapering Interconnections within an Electronic Architectural Design FIG. 4 illustrates a flowchart of an exemplary operation of the exemplary integration of the first and the second exemplary discrete tapering interconnections within an electronic architectural design according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes exemplary operation flow 400 of a computer system, such as a computer system 500 as to be described below, to integrate one or more discrete tapering interconnections, such as one or more of the discrete tapering interconnection 106, the discrete tapering interconnection 106, and/or the discrete tapering interconnection 106 to provide some examples, within an electronic architectural design.

At operation 402, the exemplary operation flow 400 identifies one or more critical interconnections from among interconnections between one or more analog circuits, one or more digital circuits, and/or one or more mixed-signal circuits within the electronic architectural design of an integrated circuit, such as the integrated circuit 100 to provide an example. The electronic architectural design represents the integrated circuit in terms of planar geometric shapes, locations of the planar geometric shapes, and/or interconnections between the planar geometric shapes. In an exemplary embodiment, the electronic architectural design can represent one or more high-level software level descriptions of the integrated circuit. In an exemplary embodiment, the one or more high-level software level descriptions can be implemented using a high-level software language, such as a graphical design tool, for example C, System C, C++, LabVIEW, and/or MATLAB, a general purpose system design language, such as like SysML, SMDL and/or SSDL, or any other suitable high-level software language or the high-level software format that will be apparent to those skilled in the relevant art(s) without departing from the spirit and scope of the present disclosure, or a high-level software format, such as Common Power Format (CPF), Unified Power Formant (UPF), or any other suitable high-level software format that will be apparent to those skilled in the relevant art(s) without departing from the spirit and scope of the present disclosure. At operation 402, the exemplary operation flow 400 computes timing of the interconnections of the integrated circuit from the architectural design. In another exemplary embodiment, the timing of the interconnections can be computed using a static timing analysis (STA). Thereafter, the exemplary operation flow 400 identifies one or more interconnections from among the interconnections between the one or more analog circuits, the one or more digital circuits, and/or the one or more mixed-signal circuits having a delay greater than a delay threshold from the timing and a length greater than a length threshold from the electronic architectural design as the one or more critical interconnections. For example, the exemplary operation flow 400 identifies one or more interconnections from among the interconnections between the one or more analog circuits, the one or more digital circuits, and/or the one or more mixed-signal circuits having a timing delay greater than approximately two picoseconds or a length greater than approximately three micrometers as the one or more critical interconnections.

At operation 404, the exemplary operation flow 400 scales power to be provided to the one or more critical interconnections identified in operation 402 by one or more electronic circuits, such as one or more of the first electronic circuit 102 to provide an example. As shown in FIG. 1 above, the one or more electronic circuits can cause the first electronic circuit 102 to interact with more capacitance and/or load than originally designed to accommodate. In this situation, the exemplary operation flow 400 increases power providing capabilities of the first electronic circuit 102 to compensate for this increased capacitance and/or load. For example, the exemplary operation flow 400 can substitute a transmitter that was included within the original electronic architectural design to another transmitter having more power providing capabilities. In an exemplary embodiment, the one or more electronic circuits can originally be implemented within the electronic architectural design using one or more first standard cells that are selected from a predefined library of standard cells. In this exemplary embodiment, the exemplary operation flow 400 can substitute the one or more first standard cells with one or more second cells from the predefined library of standard cells having more power providing capabilities when compared to the one or more first standard cells.

At operation 406, the exemplary operation flow 400 removes the one or more critical interconnections identified in operation 402 from the electronic architectural design of the integrated circuit.

At operation 408, the exemplary operation flow 400 selects a first signal pathway traversed by a first critical interconnection from among the one or more critical interconnections removed in operation 406.

At operation 410, the exemplary operation flow 400 routes a discrete tapering interconnection, such as the discrete tapering interconnection 106 as described above in FIG. 1, the asymmetric discrete tapering interconnection 200 as described above in FIG. 2, or the symmetric discrete tapering interconnection 300 as described above in FIG. 3, within the selected signal pathway.

At operation 412, the exemplary operation flow 400 selects a second signal pathway traversed by a second critical interconnection from among the one or more critical interconnections removed in operation 406. Thereafter, the exemplary operation flow 400 reverts to the operation 410 to route discrete tapering interconnection within this selected signal pathway. The exemplary operation flow 400 iteratively proceeds in this manner until the one or more critical interconnections removed in operation 406 have been substituted with discrete tapering interconnections.

Exemplary Computer System for Implementing the Exemplary Integration

Figure 5:
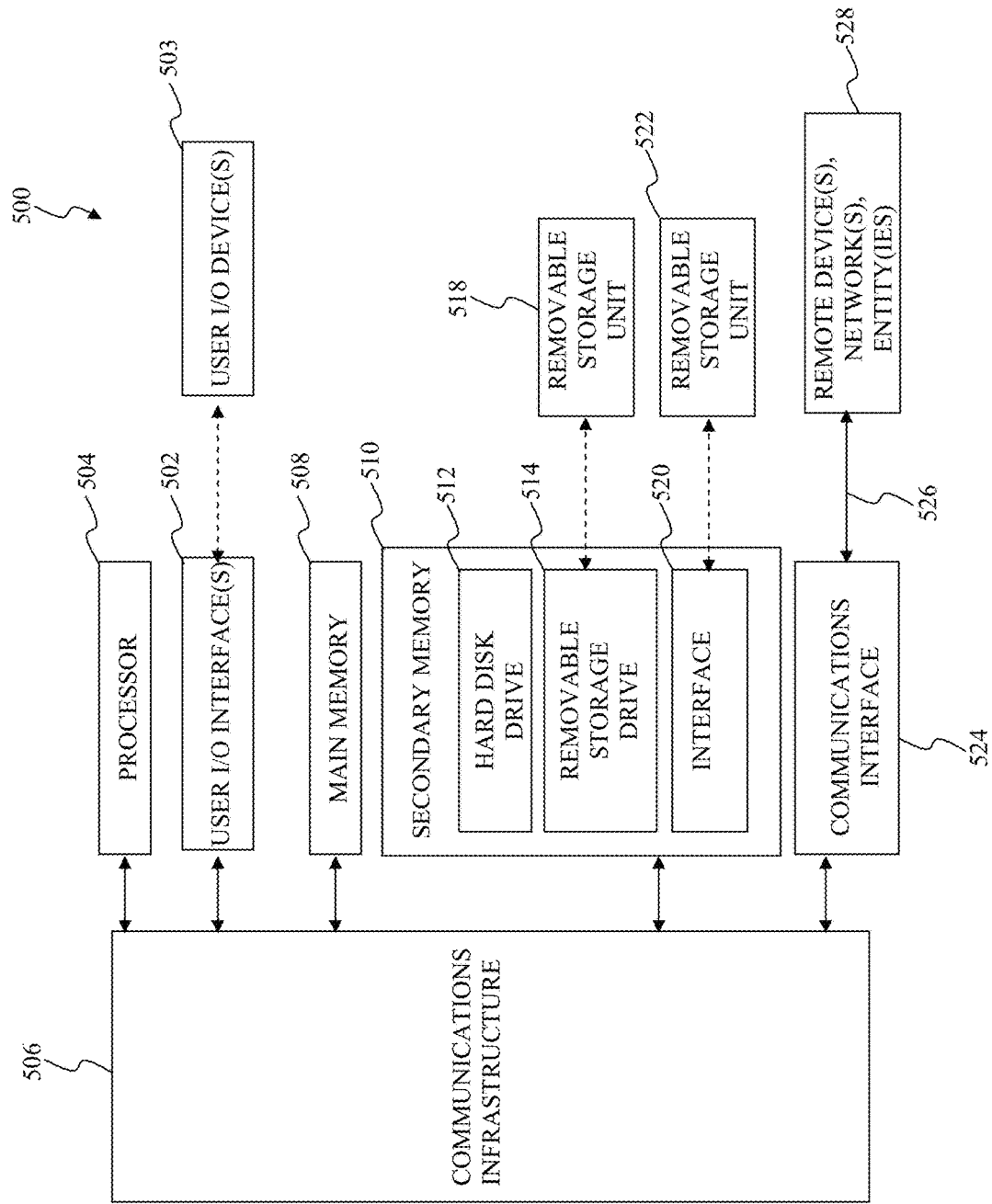
FIG. 5 illustrates a block diagram of an exemplary computer system for implementing exemplary integration of the first and the second exemplary discrete tapering interconnections within the electronic architectural design according to an exemplary embodiment of the present disclosure.

FIG. 5 illustrates a block diagram of an exemplary computer system for implementing exemplary integration of the first and the second exemplary discrete tapering interconnections within the electronic architectural design according to an exemplary embodiment of the present disclosure. A computer system 500 can be used to implement the exemplary operation flow 400. After reading this description, it will become apparent to a person skilled in the relevant art how to implement embodiments using other computer systems and/or computer architectures.

The computer system 500 includes one or more processors 504, also referred to as central processing units, or CPUs, to execute the exemplary operation flow 400 as described above in FIG. 4. The one or more processors 504 can be connected to a communication infrastructure or bus 506. In an exemplary embodiment, one or more of the one or more processors 504 can be implemented as a graphics processing unit (GPU). The GPU represents a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

The computer system 500 also includes user input/output device(s) 503, such as monitors, keyboards, pointing devices, etc., which communicate with communication infrastructure 506 through user input/output interface(s) 502.

The computer system 500 also includes a main or primary memory 508, such as a random-access memory (RAM) to provide an example. The main memory 508 can include one or more levels of cache. The main memory 508 has stored therein control logic (i.e., computer software) and/or data, such as the electronic architectural design and/or the pre-defined library of standard cells as described above in FIG. 4 to provide some examples.

The computer system 500 can also include one or more secondary storage devices or memory 510 to store the such as the electronic architectural design and/or the predefined library of standard cells as described above in FIG. 4 to provide some examples. The one or more secondary storage devices or memory 510 can include, for example, a hard disk drive 512 and/or a removable storage device or drive 514. The removable storage drive 514 may be a floppy disk drive, a magnetic tape drive, a compact disk drive, an optical storage device, tape backup device, and/or any other storage device/drive. The removable storage drive 514 may interact with a removable storage unit 518. The removable storage unit 518 includes a computer usable or readable storage device having stored thereon computer software (control logic) and/or data. The removable storage unit 518 may be a floppy disk, magnetic tape, compact disk, DVD, optical storage disk, and/any other computer data storage device. The removable storage drive 514 reads from and/or writes to removable storage unit 518 in a well-known manner.

According to an exemplary embodiment, the one or more secondary storage devices or memory 510 may include other means, instrumentalities or other approaches for allowing computer programs and/or other instructions and/or data to be accessed by computer system 500. Such means, instrumentalities or other approaches may include, for example, a removable storage unit 522 and an interface 520. Examples of the removable storage unit 522 and the interface 520 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

The computer system 500 may further include a communication or network interface 524. The communication or network interface 524 enables the computer system 500 to communicate and interact with any combination of remote devices, remote networks, remote entities, etc. (individually and collectively referenced by reference number 528). For example, the communication or network interface 524 may allow the computer system 500 to communicate with the remote devices 528 over a communications path 526, which may be wired and/or wireless, and which may include any combination of LANs, WANs, the Internet, etc. Control logic and/or data may be transmitted to and from the computer system 500 via communication path 526.

In an embodiment, a tangible apparatus or article of manufacture comprising a tangible computer useable or readable medium having control logic (software) stored thereon is also referred to herein as a computer program product or program storage device. This includes, but is not limited to, the computer system 500, the main memory 508, the secondary memory 510, and the removable storage units 518 and 522, as well as tangible articles of manufacture embodying any combination of the foregoing. Such control logic, that when executed by one or more data processing devices (such as computer system 500), causes such data processing devices to operate as described herein.

Based on the teachings contained in this disclosure, it will be apparent to persons skilled in the relevant art(s) how to make and use the invention using data processing devices, computer systems and/or computer architectures other than that shown in FIG. 5. In particular, embodiments may operate with software, hardware, and/or operating system implementations other than those described herein.

CONCLUSION

The foregoing Detailed Description discloses an integrated circuit including a first electronic circuit, a second electronic circuit, and a discrete tapering interconnection. The discrete tapering interconnection, which is connected between the first electronic circuit and the second electronic circuit, includes a first set of parallel conductors and a second set of parallel conductors. The first set of parallel conductors is situated in a first metal layer of a plurality of metal layers of a semiconductor stack and forms a discrete tapering of the first set of parallel conductors between the first electronic circuit and the second electronic circuit. The second set of parallel conductors is situated in a second metal layer of the plurality of metal layers of the semiconductor stack and provides interconnections among the first set of parallel conductors.

The foregoing Detailed Description also discloses an asymmetric discrete tapering interconnection having a first set of parallel conductors and a second set of parallel conductors. The first set of parallel conductors is situated in a first metal layer of metal layers of a semiconductor stack. Each conductor having a length that is different from one another to form an asymmetric discrete tapering of the first set of parallel conductors. The second set of parallel conductors is situated in a second metal layer of the plurality of metal layers of the semiconductor stack and provides interconnections among the first set of parallel conductors.

The foregoing Detailed Description further discloses a symmetric discrete tapering interconnection having a first set of parallel conductors and a second set of parallel conductors. The first set of parallel conductors is situated in a first metal layer of metal layers of a semiconductor stack. The first set of parallel conductors is characterized as including a plurality of groups of conductors, each group of conductors including at least two conductors from among the first set of parallel conductors. Each group of conductors is characterized as having a length that are different from one another to form a symmetric discrete tapering of the first set of parallel conductors. The second set of parallel conductors is situated in a second metal layer of the plurality of metal layers of the semiconductor stack and provides interconnections among the first set of parallel conductors.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A system for implementing a discrete tapering interconnection within an integrated circuit, the system comprising:
   a memory that stores a plurality of instructions; and
   a processor configured to execute the plurality of instructions, the plurality of instructions, when executed by the processor, configuring the processor to:
   identify and remove an interconnection between a first electronic circuit and a second electronic circuit of the integrated circuit,
   form a first set of parallel conductors from among a plurality of conductors in a first metal layer of a plurality of metal layers of a semiconductor stack, the first set of parallel conductors being arranged to form a discrete tapering of the first set of parallel conductors between the first electronic circuit and the second electronic circuit,
   form a second set of parallel conductors from among the plurality of conductors in a second metal layer of the plurality of metal layers of the semiconductor stack, and
   connect the first set of parallel conductors and the second set of parallel conductors to form the discrete tapering interconnection.

2. The system of claim 1, wherein the interconnection is from among a plurality of interconnections, and
   wherein the plurality of instructions, when executed by the processor, further configure the processor to:
   iteratively identify and remove, form the first set of parallel conductors, form the second set of parallel conductors, and connect for each interconnection from among the plurality of interconnections.

3. The system of claim 1, wherein the plurality of instructions, when executed by the processor, configure the processor to:
   identify and remove the interconnection from an electronic architectural design of the integrated circuit.

4. The system of claim 3, wherein the plurality of instructions, when executed by the processor, further configure the processor to:
   compute timing of a plurality of interconnections of the integrated circuit from the electronic architectural design;
   identify a plurality of critical interconnections from among the plurality of interconnections based upon the timing; and
   select the interconnection from among the plurality of critical interconnections.

5. The system of claim 4, wherein the plurality of instructions, when executed by the processor, further configure the processor to:
   identify interconnections from among the plurality of interconnections having a timing delay greater than approximately two picoseconds or a length greater than approximately three micrometers as the plurality of critical interconnections.

6. The system of claim 1, wherein the plurality of instructions, when executed by the processor, further configure the processor to:
   scale power to be provided to the discrete tapering interconnection by the first electronic circuit.

7. The system of claim 6, wherein the plurality of instructions, when executed by the processor, further configure the processor to:
   increase a power providing capability of the first electronic circuit to compensate for the discrete tapering interconnection.

8. A system for implementing a discrete tapering interconnection within an integrated circuit, the system comprising:
   a memory that stores a plurality of instructions; and
   a processor configured to execute the plurality of instructions, the plurality of instructions, when executed by the processor, configuring the processor to:

identify and remove an interconnection between a first electronic circuit and a second electronic circuit from an electronic architectural design of the integrated circuit, substitute the first electronic circuit to be a first standard cell from a library of standard cells from a second standard cell from the library of standard cells in the electronic architectural design, form a first set of parallel conductors from among a plurality of conductors in a first metal layer of a plurality of metal layers of a semiconductor stack, the first set of parallel conductors being arranged to form a discrete tapering of the first set of parallel conductors between the first electronic circuit and the second electronic circuit, and connect a second set of parallel conductors from among the plurality of conductors formed in a second metal layer of the plurality of metal layers of the semiconductor stack to the first set of parallel conductors to form the discrete tapering interconnection.

9. The system of claim 8, wherein the interconnection is from among a plurality of interconnections, and
wherein the plurality of instructions, when executed by the processor, further configure the processor to:
iteratively identify and remove, form the first set of parallel conductors, and form the second set of parallel conductors for each interconnection from among the plurality of interconnections.

10. The system of claim 8, wherein the plurality of instructions, when executed by the processor, configure the processor to:
identify and remove the interconnection from the electronic architectural design.

11. The system of claim 10, wherein the plurality of instructions, when executed by the processor, further configure the processor to:
compute timing of a plurality of interconnections of the integrated circuit from the electronic architectural design;
identify a plurality of critical interconnections from among the plurality of interconnections based upon the timing; and
select the interconnection from among the plurality of critical interconnections.

12. The system of claim 11, wherein the plurality of instructions, when executed by the processor, further configure the processor to:
identify interconnections from among the plurality of interconnections having a timing delay greater than approximately two picoseconds or a length greater than approximately three micrometers as the plurality of critical interconnections.

13. The system of claim 8, wherein the plurality of instructions, when executed by the processor, configure the processor to:
substitute the first electronic circuit to be the first standard cell from the second standard cell to increase a power providing capability of the first electronic circuit to compensate for the discrete tapering interconnection.

14. A system for implementing a discrete tapering interconnection within an integrated circuit, the system comprising:
a memory that stores a plurality of instructions; and
a processor configured to execute the plurality of instructions, the plurality of instructions, when executed by the processor, configuring the processor to:
identify and remove an interconnection between a first electronic circuit and a second electronic circuit of the integrated circuit,
form a first set of conductors from among a plurality of conductors in a first layer of a plurality of layers of a semiconductor stack, the first set of conductors being arranged to form a discrete tapering of the first set of conductors between the first electronic circuit and the second electronic circuit,
form a second set of conductors from among the plurality of conductors in a second layer of the plurality of layers of the semiconductor stack, and
connect the first set of conductors and the second set of conductors to form the discrete tapering interconnection.

15. The system of claim 14, wherein the interconnection is from among a plurality of interconnections, and
wherein the plurality of instructions, when executed by the processor, further configure the processor to:
iteratively identify and remove the interconnection, form the first set of conductors, form the second set of conductors, and connect the first set of conductors and the second set of conductors for each interconnection from among the plurality of interconnections.

16. The system of claim 14, wherein the plurality of instructions, when executed by the processor, configure the processor to:
identify and remove the interconnection from an electronic architectural design of the integrated circuit.

17. The system of claim 14, wherein the plurality of instructions, when executed by the processor, further configure the processor to:
compute timing of a plurality of interconnections of the integrated circuit from the electronic architectural design;
identify a plurality of critical interconnections from among the plurality of interconnections based upon the timing; and
select the interconnection from among the plurality of critical interconnections.

18. The system of claim 17, wherein the plurality of instructions, when executed by the processor, further configure the processor to:
identify interconnections from among the plurality of interconnections having a timing delay greater than approximately two picoseconds or a length greater than approximately three micrometers as the plurality of critical interconnections.

19. The system of claim 14, wherein the plurality of instructions, when executed by the processor, further configure the processor to:
scale power to be provided to the discrete tapering interconnection by the first electronic circuit.

20. The system of claim 19, wherein the plurality of instructions, when executed by the processor, further configure the processor to:
increase a power providing capability of the first electronic circuit to compensate for the discrete tapering interconnection.

* * * * *